(12) United States Patent
Nakagawa et al.

(10) Patent No.: US 10,114,284 B2
(45) Date of Patent: Oct. 30, 2018

(54) METHOD FOR DESIGNING MASK SET, RECORDING MEDIUM, TEMPLATE, AND METHOD FOR MANUFACTURING TEMPLATE

(71) Applicant: TOSHIBA MEMORY CORPORATION, Tokyo (JP)

(72) Inventors: Shinichiro Nakagawa, Yokohama (JP); Masafumi Asano, Yokohama (JP)

(73) Assignee: Toshiba Memory Corporation, Tokyo (JP)

( * ) Notice: Subject to any disclaimer, the term of this patent is extended or adjusted under 35 U.S.C. 154(b) by 898 days.

(21) Appl. No.: 14/139,985

(22) Filed: Dec. 24, 2013

(65) Prior Publication Data

US 2015/0037713 A1 Feb. 5, 2015

(30) Foreign Application Priority Data

Aug. 5, 2013 (JP) ................................. 2013-162723

(51) Int. Cl.
*G03F 1/42* (2012.01)
*G03F 1/68* (2012.01)
(Continued)

(52) U.S. Cl.
CPC .......... *G03F 7/0002* (2013.01); *H01L 23/544* (2013.01); *H01L 2223/5446* (2013.01);
(Continued)

(58) Field of Classification Search
CPC ........... G03F 7/0002; H01L 2924/0002; H01L 23/544; H01L 2223/54426; H01L 2223/5446
See application file for complete search history.

(56) References Cited

U.S. PATENT DOCUMENTS 8,012,395 B2   9/2011   Selinidis et al.
8,850,980 B2   10/2014  Sreenivasan et al.
(Continued)

FOREIGN PATENT DOCUMENTS

JP   2009-532908   9/2009
JP   2010-225683   10/2010
(Continued)

OTHER PUBLICATIONS

Notice of Rejection issued by the Japanese Patent Office dated Dec. 22, 2015, for Japanese Patent Application No. 2013-162723, and English-language translation thereof.
(Continued)

*Primary Examiner* — Robert J Grun
(74) *Attorney, Agent, or Firm* — Finnegan, Henderson, Farabow, Garrett & Dunner, L.L.P.

(57) ABSTRACT

According to an embodiment, a method for designing a mask set is provided. In the method for designing the mask set, an imprint-alignment mark is arranged in a region other than a chip region in an imprint shot formed in a template. The imprint-alignment mark is used for alignment during an imprint. Subsequently, the shape of the imprint shot is set based on an arrangement position of the imprint-alignment mark. Subsequently, another pattern is arranged in a region where the region is other than the chip region in the imprint shot and the imprint-alignment mark is not arranged. The other pattern is used in a process other than the imprint.

5 Claims, 14 Drawing Sheets

(51) Int. Cl.
 *G06F 17/50* (2006.01)
 *G03F 7/00* (2006.01)
 *H01L 23/544* (2006.01)

(52) U.S. Cl.
 CPC .............. *H01L 2223/54426* (2013.01); *H01L 2924/0002* (2013.01)

(56) References Cited

U.S. PATENT DOCUMENTS

| | | | |
|---|---|---|---|
| 2007/0247608 A1* | 10/2007 | Sreenivasan | B82Y 10/00 355/75 |
| 2010/0237540 A1 | 9/2010 | Inanami et al. | |
| 2011/0018168 A1* | 1/2011 | Wuister | B82Y 10/00 264/293 |
| 2011/0273684 A1 | 11/2011 | Owa et al. | |
| 2011/0290136 A1 | 12/2011 | Koga | |

FOREIGN PATENT DOCUMENTS

| | | |
|---|---|---|
| JP | 2011-253839 | 12/2011 |
| JP | 2012-004515 | 1/2012 |
| JP | 2012-253112 | 12/2012 |
| WO | WO 2009/153925 A1 | 12/2009 |

OTHER PUBLICATIONS

U.S. Appl. No. 60/788,807, filed Oct. 25, 2007, Sreenivasan et al.
U.S. Appl. No. 60/862,480, filed Oct. 25, 2007, Sreenivasan et al.

* cited by examiner

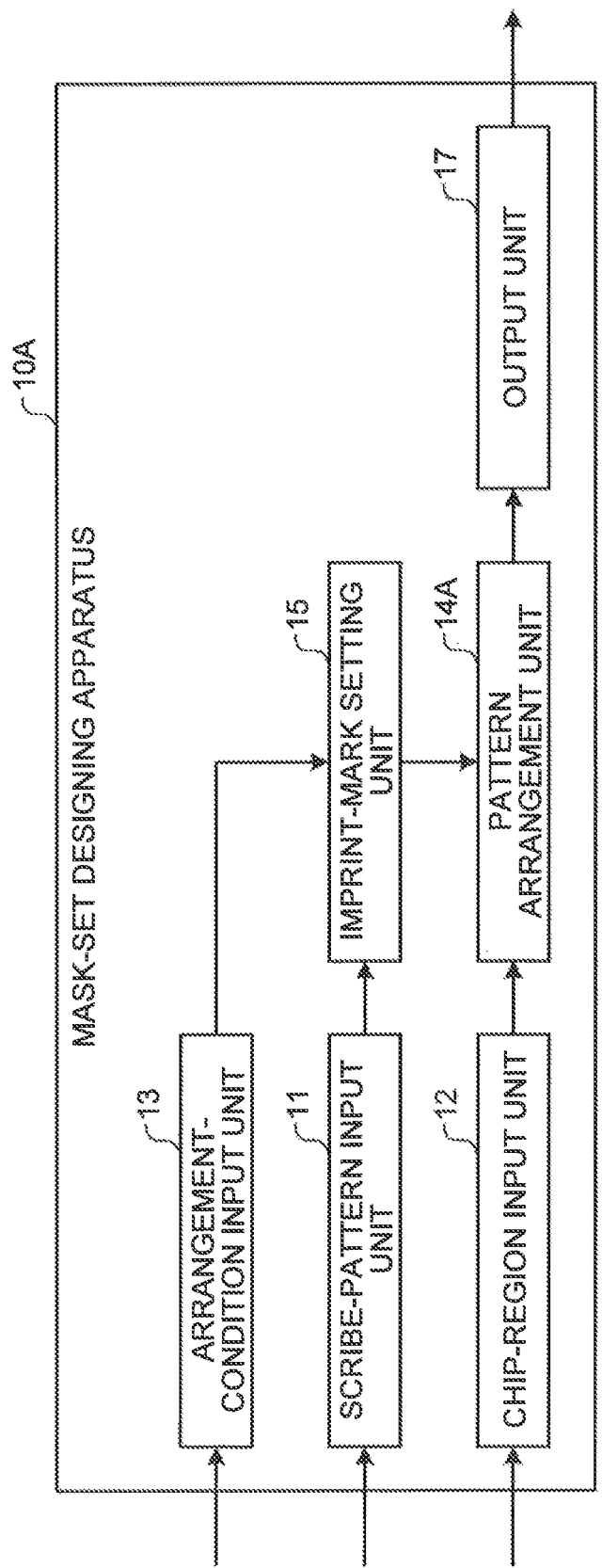

INITIAL STATE

AFTER TEMPORARY ARRANGEMENT PROCESS

AFTER SHOT-SHAPE
SETTING PROCESS

AFTER OTHER-PATTERN
ARRANGEMENT PROCESS

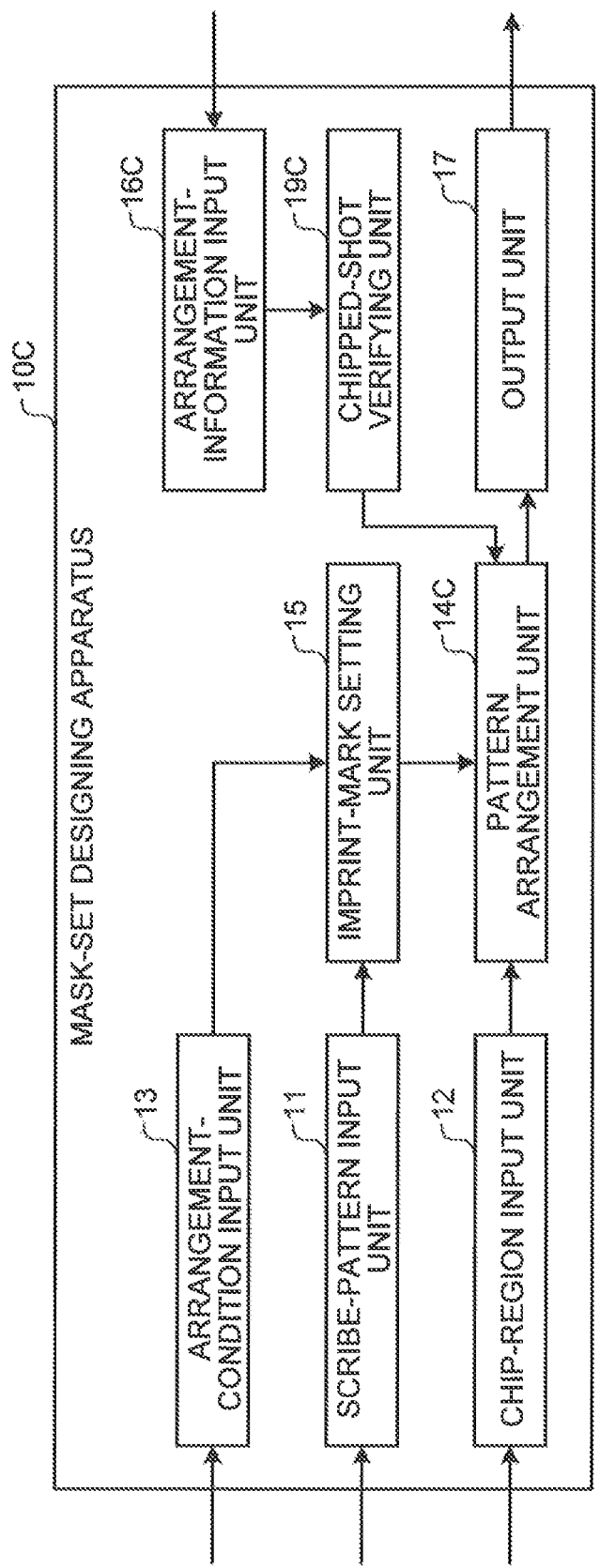

METHOD FOR DESIGNING MASK SET, RECORDING MEDIUM, TEMPLATE, AND METHOD FOR MANUFACTURING TEMPLATE

CROSS-REFERENCE TO RELATED APPLICATIONS

This application is based upon and claims the benefit of priority from Japanese Patent Application No. 2013-162723, filed on Aug. 5, 2013; the entire contents of which are incorporated herein by reference.

FIELD

Embodiments described herein relate generally to a method for designing a mask set, recording medium, template, and method for manufacturing template.

BACKGROUND

Conventionally, photolithography has been used in almost all pattern transfer processes during fabrication of a semiconductor apparatus. Therefore, conventionally, a mask set applied to a photomask is used. In a shot arrangement on a wafer in this photolithography process, scribe line regions between adjacent shots are arranged to overlap one another.

However, in an imprint (an imprint lithography process) using jet and flash imprint lithography, the resist is hardened on the wafer for each one shot. Accordingly, in the imprint, in the case where patterning is performed such that respective scribe line regions overlap one another between adjacent shots, the template is imprinted onto a region where the resist is already hardened. As a result, riding up of pattern onto the adjacent shot occurs. Thus, the scribe line regions cannot be arranged overlapping one another on the wafer between adjacent shots.

As described above, a method for forming a pattern on a scribe line differs between the imprint and the photolithography. This poses a problem for mix-and-match between the template and the photomask. Therefore, it has been difficult to apply the imprint to the fabrication of the semiconductor apparatus. Then, it is desired to facilitate designing the mask set that includes the imprint.

BRIEF DESCRIPTION OF THE DRAWINGS

FIG. 1 is a block diagram illustrating a configuration of a mask-set designing apparatus according to a first embodiment;

FIG. 7 is a block diagram illustrating a configuration of a mask-set designing apparatus according to a third embodiment;

DETAILED DESCRIPTION

Figure 2A:
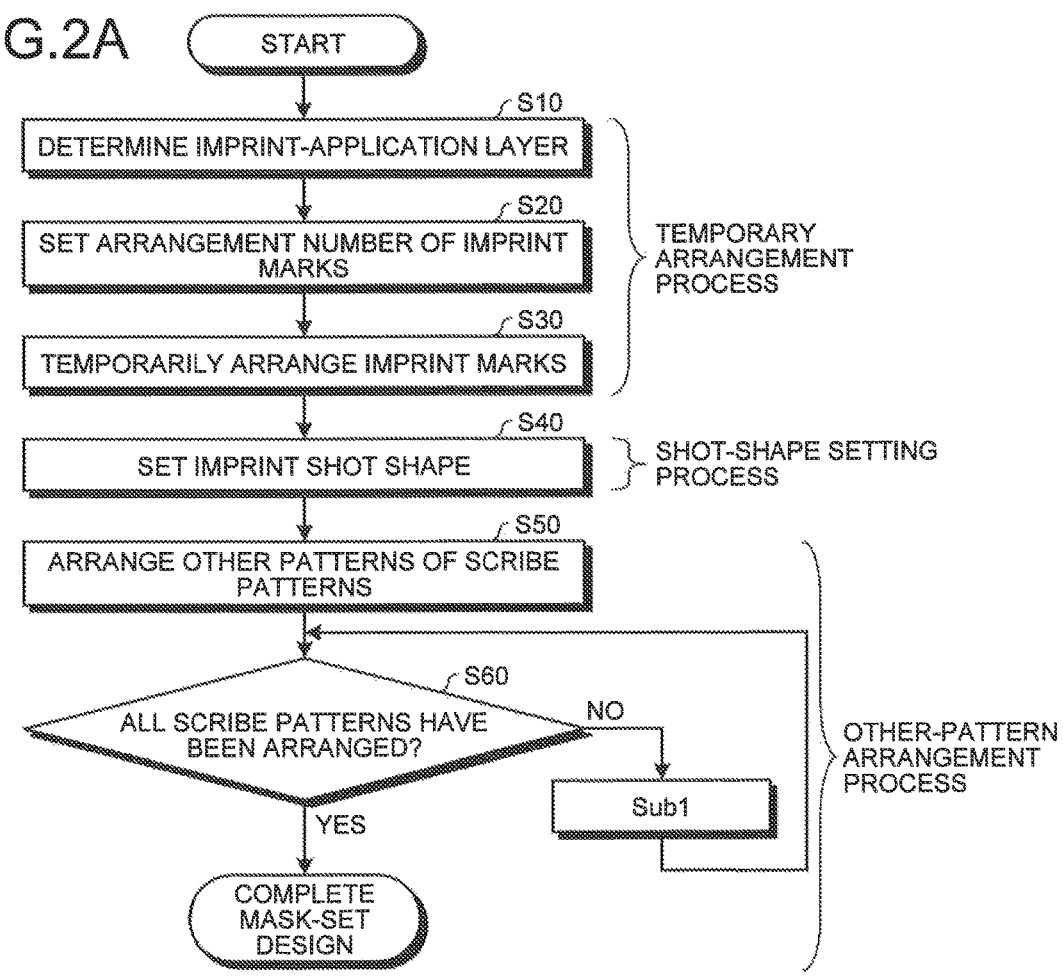
FIGS. 2A and 2B are flowcharts illustrating a processing procedure of mask-set designing processing according to the first embodiment.

According to an embodiment, a method for designing a mask set is provided. In the method for designing the mask set, an imprint-alignment mark is arranged in a region other than a chip region in an imprint shot formed in a template. The imprint-alignment mark is used for alignment during an imprint. Subsequently, the shape of the imprint shot is set based on an arrangement position of the imprint-alignment mark. Subsequently, another pattern is arranged in a region where the region is other than the chip region in the imprint shot and the imprint-alignment mark is not arranged. The other pattern is used in a process other than the imprint.

Exemplary embodiments of a method for designing a mask set, recording medium, template, and method for manufacturing template will be described below in detail with reference to the accompanying drawings. The present invention is not limited to the following embodiments.

First Embodiment

FIG. 1 is a block diagram illustrating a configuration of a mask-set designing apparatus according to a first embodiment. A mask-set designing apparatus 10A is, for example, a computer for designing a mask set that includes an imprint. The mask-set designing apparatus 10A performs, for example, arrangement processing of an imprint mark (an imprint mark 20 described later) on a scribe line, setting processing of an imprint shot shape, and arrangement processing of a pattern other than the imprint mark 20 (other patterns 30 described later).

The mask-set designing apparatus 10A designs a mask set that are patterns used in a pattern transfer process during fabrication of a semiconductor apparatus. The mask-set designing apparatus 10A arranges scribe patterns (mask set patterns) on a scribe line (dicing line) in an imprint shot, so as to design a mask set. The scribe line is arranged between regions where respective semiconductor chips are formed (circuit pattern regions).

The scribe patterns input to the mask-set designing apparatus 10A includes, for example, a positioning mark for imprint (alignment mark), a positioning mark for exposure, an overlay (OL) inspection mark, and a Test Element Group (TEG).

During imprint and during exposure, a positioning mark formed on a lower layer side is used for positioning a pattern on an upper layer side. For example, during imprint, the positioning mark generated on the lower layer side by imprint or exposure is used for positioning the pattern on the upper layer side. During exposure, the positioning mark generated on the lower layer side by imprint or exposure is used for positioning the pattern on the upper layer side.

The OL inspection mark is a mark used for measuring an overlay displacement between the pattern on the upper layer side and the pattern on the lower layer side. The overlay displacement between an OL inspection mark formed on the lower layer side and an OL inspection mark formed on the upper layer side is measured so as to measure the overlay displacement between the upper and lower layers. The OL inspection marks include an OL inspection mark for an imprint process and an OL inspection mark for an exposure process. The OL inspection mark for the imprint process is used in an overlay displacement inspection after the imprint process. The OL inspection mark for the exposure process is used in an overlay displacement inspection after the exposure process. The TEG is a test pattern for measuring parameters related to electrical characteristics of the semiconductor apparatus.

In the following description, a description will be given of the scribe patterns separated into the imprint marks 20 and the other patterns 30 other than the imprint mark 20. The imprint mark 20 is a positioning mark for imprint (wafer alignment mark). The other patterns 30 include, for example, the positioning mark for exposure, the OL inspection mark for the exposure process, the OL inspection mark for the imprint process, and the TEG. The other pattern 30 is a pattern on a scribe line of a photomask for mix-and-match with an imprint.

The mask-set designing apparatus 10A arranges respective patterns of the scribe patterns (mask set) such that each scribe pattern formed in a pattern transfer process does not affect (for example, not overlap) scribe patterns formed in another pattern transfer process.

The mask-set designing apparatus 10A of this embodiment sets a shot shape for imprint (the imprint shot shape) to a shape of a jigsaw-puzzle piece (jigsaw form). In other words, the mask-set designing apparatus 10A sets a region with scribe patterns on a scribe line (protruding region) and a region without any scribe pattern (depressed region). Here, the protruding region is a portion protruding from a rectangular region at the center portion of the imprint shot in top view. The depressed region is a portion without any protruding region at the outer peripheral portion of the imprint shot in top view. The mask-set designing apparatus 10A arranges the protruding regions and the depressed regions such that the protruding region and the depressed region overlap one another, yet the respective protruding regions do not overlap one another between adjacent imprint shots.

Specifically, the mask-set designing apparatus 10A arranges the protruding regions and the depressed regions such that the protruding region and the depressed region face each other across a chip region. In other words, the mask-set designing apparatus 30A sets an imprint shot shape such that the outer peripheral portion of the imprint shot has an uneven portion as a combination of a region that allows pattern arrangement and a region that does not allow pattern arrangement. Furthermore, the mask-set designing apparatus 10A sets an imprint shot shape such that the protruding region and the depressed region in the uneven portion fit each other so as to constitute a scribe line between imprint shots to be adjacent to each other when the imprint shots are arranged.

The mask-set designing apparatus 10A includes a scribe-pattern input unit 11, a chip-region input unit 12, an arrangement-condition input unit 13, a pattern arrangement unit 14A, an imprint-mark setting unit 15, and an output unit 17.

The scribe-pattern input unit 11 receives scribe patterns and transmits these scribe patterns to the imprint-mark setting unit 15. The data of the scribe patterns input to the scribe-pattern input unit 11 includes information indicative of the layer on which the scribe patterns are formed, information indicating which of imprint or photolithography is used to transfer each pattern of the scribe patterns, a pattern shape, pattern dimensions, and similar information.

The chip-region input unit 12 receives a chip region of the semiconductor chip and transmits this chip region to the pattern arrangement unit 14A. The chip region is a region where a circuit pattern that constitutes the semiconductor chip is formed (chip dimensions and the number of chips within one shot).

The arrangement-condition input unit 13 receives arrangement conditions and transmits these arrangement conditions to the imprint-mark setting unit 15. The arrangement conditions include, for example, restricting conditions during arrangement of the scribe patterns. The arrangement conditions include, for example, (Arrangement Condition 1) to (Arrangement Condition 4) as follows.
(Arrangement Condition 1) The number of arrangement positions of the imprint marks 20 set in each layer
(Arrangement Condition 2) Restriction on the arrangement positions of the imprint marks 20
(Arrangement Condition 3) Restriction on a scribe line shape
(Arrangement Condition 4) Restriction on arrangement positions of the other patterns 30

The imprint-mark setting unit 15 specifies a layer to be imprinted, based on the scribe patterns. The imprint-mark setting unit 15 sets, for example, the arrangement number of the imprint marks 20 for each layer to be imprinted, based on the arrangement conditions. The imprint-mark setting unit 15 transmits the scribe patterns, the arrangement conditions, the set arrangement number (N pieces) of the imprint marks 20, and similar information to the pattern arrangement unit 14A.

The pattern arrangement unit 14A sets a scribe line between semiconductor chips in the imprint shot and a scribe line arranged in the outer peripheral portion of the imprint shot, based on the arrangement conditions and the chip region.

The pattern arrangement unit 14A temporarily arranges N pieces of the imprint marks 20 on the scribe line between the semiconductor chip regions or on the scribe line set in the outer peripheral portion of the imprint shot, based on the arrangement conditions. In the subsequent process, the imprint mark 20 is moved as necessary. Accordingly, in the case where the imprint mark 20 is not moved in the subsequent process, the arrangement of the imprint marks 20 here is set as a permanent arrangement, not as temporary arrangement.

The pattern arrangement unit 14A sets the imprint shot shape (the protruding region and the depressed region) such that the temporarily arranged imprint marks 20 are arranged on the scribe line. In other words, the pattern arrangement unit 14A sets the imprint shot shape such that the temporarily arranged imprint marks 20 are arranged within the protruding region.

After setting the imprint shot shape, the pattern arrangement unit 14A arranges the other patterns 30 of the scribe patterns in the remaining regions on the scribe line. The pattern arrangement unit 14A checks whether or not all the other patterns 30 can be arranged in the set imprint shot. In the case where the arrangement is not possible, the pattern arrangement unit 14A adjusts the arrangement of the imprint marks 20 or the other patterns 30. The pattern arrangement unit 14A arranges all the scribe patterns in the imprint shot, and transmits arrangement data as a mask set to the output unit 17. The output unit 17 outputs the mask set to an external device or similar device.

Figure 2B:
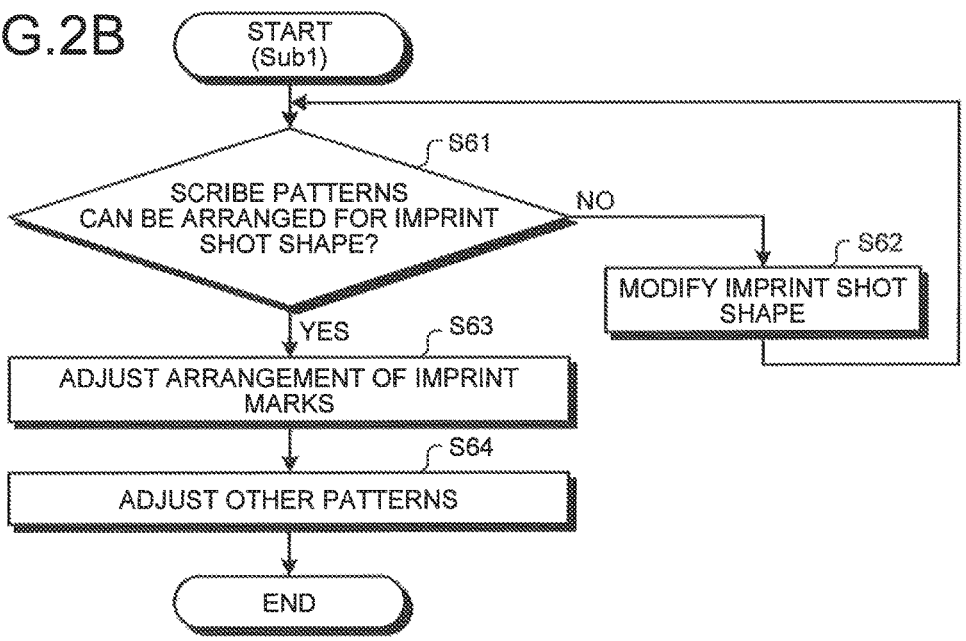

Next, a description will be given of a design processing procedure of the mask set according to the first embodiment. FIGS. 2A and 2B are flowcharts illustrating a processing procedure of mask-set designing processing according to the first embodiment. FIG. 2A illustrates arrangement processing of the imprint marks 20 and the other patterns 30 in the mask-set designing processing. FIG. 2B illustrates the arrangement adjusting processing of the imprint marks 20 or the other patterns 30 in the mask-set designing processing.

The scribe-pattern input unit 11 receives the scribe patterns, and transmits these scribe patterns to the imprint-mark setting unit 15. The arrangement-condition input unit 13 receives the arrangement conditions, and transmits these arrangement conditions to the imprint-mark setting unit 15. The chip-region input unit 12 receives the chip region of the semiconductor chip, and transmits this chip region to the pattern arrangement unit 14A.

The imprint-mark setting unit 15 specifies a layer to be imprinted, based on the scribe patterns. Specifically, the imprint-mark setting unit 15 extracts the imprint marks 20 formed by the imprint from the scribe patterns, and determines a layer corresponding to the extracted imprint marks 20 as an imprint-application layer (in step S10).

The imprint-mark setting unit 15 sets, for example, the arrangement number (N pieces) of the imprint marks 20 based on the arrangement condition 1 (in step S20). The arrangement condition 1 specifies, for example, eight positions or four positions as the number of arrangement positions of the imprint marks 20. The imprint-mark setting unit 15 transmits a scribe line pattern, the arrangement conditions, and the set imprint marks 20 to the pattern arrangement unit 14A.

Figure 3A:
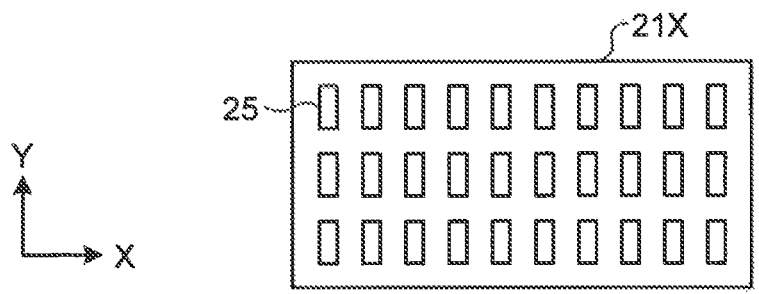
FIGS. 3A to 3C are diagrams illustrating an exemplary configuration of imprint marks.
Figure 3B:
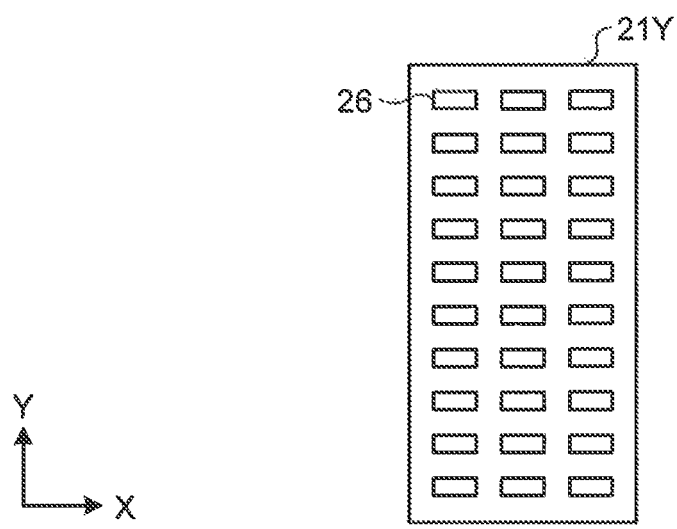
Figure 3C:
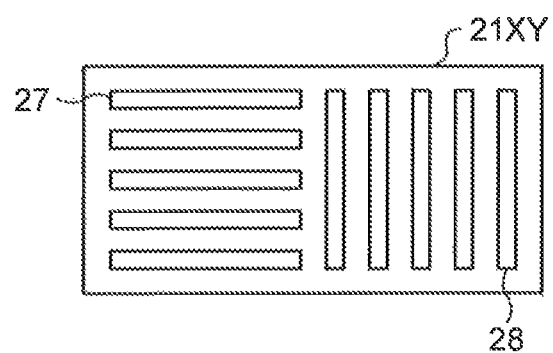

FIGS. 3A to 3C are diagrams illustrating an exemplary configuration of the imprint marks. The imprint marks includes a one-dimensional mark and a two-dimensional mark. FIG. 3A and FIG. 3B each illustrate a top view of a one-dimensional mark. FIG. 3C illustrates a top view of a two-dimensional mark. FIG. 3A illustrates an imprint mark 21X with an arrangement in the X direction. FIG. 3B illustrates an imprint mark 21Y with an arrangement in the Y direction. FIG. 3C illustrates an imprint mark 21XY with arrangements in the X direction and the Y direction.

In the imprint mark 21X as one example of the imprint mark 20, line patterns 25 that extend in the Y direction are arranged parallel to one another in the Y direction. In the imprint mark 21Y as one example of the imprint mark 20, line patterns 26 that extend in the X direction are arranged parallel to one another in the X direction. In the imprint mark 21XY as one example of the imprint mark 20, line patterns 28 that extend in the Y direction are arranged parallel to one another in the Y direction and line patterns 27 that extend in the X direction are arranged parallel to one another in the X direction.

The pattern arrangement unit 14A sets a scribe line between the semiconductor chips in the imprint shot and a scribe line arranged in the outer peripheral portion of the imprint shot, based on the arrangement conditions and the chip region.

FIG. 4A to FIG. 4D are diagrams for describing setting processing of the imprint shot. FIG. 4A to FIG. 4D each illustrate a top view of the imprint shot. Here, the case where four chip regions 31 are arranged in imprint shots 1 to 4 will be described.

Figure 4A:
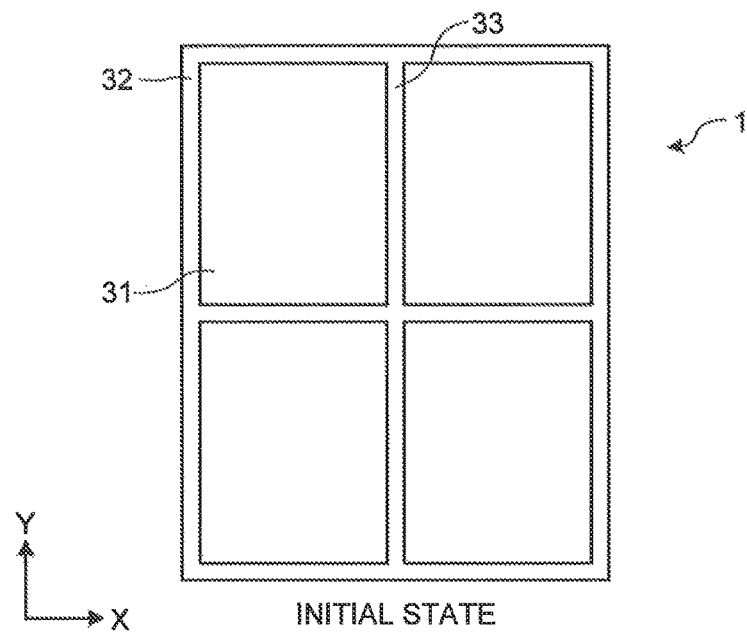
FIG. 4A is a diagram illustrating an initial state of an imprint shot.

FIG. 4A is a diagram illustrating the initial state of the imprint shot. The pattern arrangement unit 14A sets a scribe line 33 between the chip regions 31 in the imprint shot 1 and a scribe line 32 arranged in the outer peripheral portion of the imprint shot 1. This state where the chip regions 31 and the scribe lines 32 and 33 are set is the initial state of the imprint shot (the imprint shot 1).

Subsequently, the pattern arrangement unit 14A temporarily arranges the imprint marks 20 on the scribe lines 32 and 33 based on the arrangement conditions (in step S30). Steps S10 to S30 described above are a temporary arrangement process of the imprint marks 20.

Figure 4B:
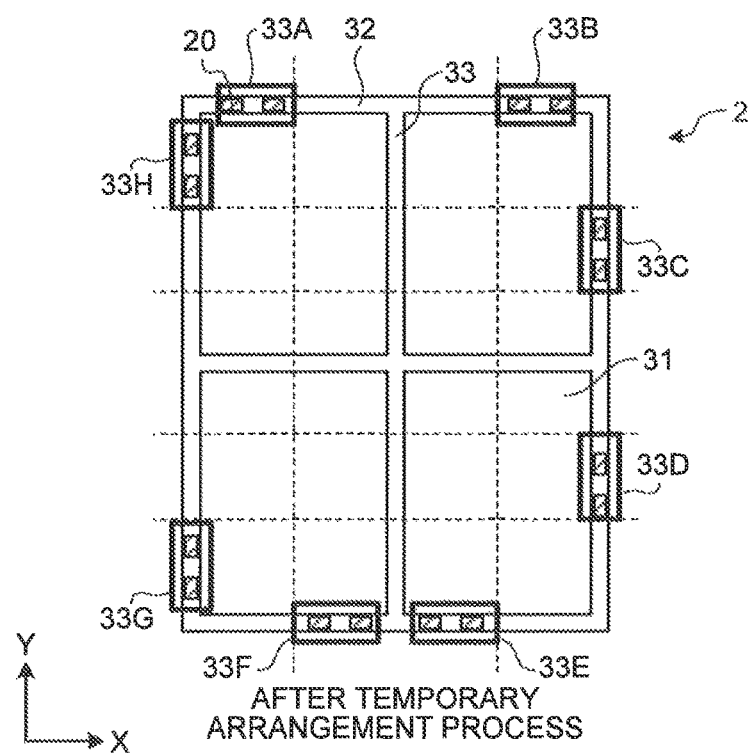
FIG. 4B is a diagram illustrating a state where the imprint marks are temporarily arranged with respect to the imprint shot.

FIG. 4B is a diagram illustrating a state where the imprint marks are temporarily arranged with respect to the imprint shot. The imprint shot 2 is an imprint shot after the temporary arrangement process of the imprint marks. The pattern arrangement unit 14A temporarily arranges regions where the imprint marks 20 are arranged (imprint-mark-arrangement regions 33A to 33H) in the imprint shot 1, so as to temporarily arrange the imprint marks 20.

Here, the imprint-mark-arrangement regions 33A to 33H protrude from the scribe line 32. However, the actual imprint-mark-arrangement regions 33A to 33H are regions within the scribe line 32.

Here, a description will be given of arrangement processing of the imprint mark 20 in the case where an imprint process is performed in two layers. In the case where an imprint process is performed in two layers, two imprint marks 20 are arranged for each of the imprint-mark-arrangement regions 33A to 33H. The imprint marks 20 in each of the imprint-mark-arrangement regions 33A to 33H includes the imprint mark 20 in a first layer at one side and the imprint mark 20 in a second layer at the other side.

The pattern arrangement unit 14A arranges the imprint-mark-arrangement regions 33A to 33H, for example, on the scribe line 32 based on the arrangement condition 2. The arrangement condition 2 specifies that, for example, the imprint marks 20 (the imprint-mark-arrangement regions) are arranged at the proximity of four corners of the imprint shot 1. Specifically, it is specified that, for example, the imprint marks 20 are arranged in positions within a predetermined distance from four apexes of the imprint shot 1 in the imprint shot 2. Additionally, the arrangement condition 2 specifies, for example, the distance between the imprint marks 20 (distance to be separated).

Additionally, the arrangement condition 2 specifies that, for example, the respective imprint marks 20 are not arranged in positions facing one another in the X direction via the chip regions 31 or not arranged in positions facing one another in the Y direction via the chip regions 31. In other words, it is specified that, for example, the imprint marks 20 are arranged such that the imprint marks 20 do not overlap one another between adjacent imprint shots.

Specifically, a pair of the imprint marks 20 is arranged in positions facing each other in the X direction via both the chip region 31 and the scribe line 33. Subsequently, the Y coordinate of the imprint mark 20 at one side is slightly moved. A pair of the imprint marks 20 is arranged in positions facing each other in the Y direction via both the chip region 31 and the scribe line 33. Subsequently, the X coordinate of the imprint mark 20 at one side is slightly moved.

For example, in the case where the pattern arrangement unit 14A arranges imprint-mark-arrangement regions 33A and 33F, the pattern arrangement unit 14A arranges the imprint-mark-arrangement region 33A and then arranges the imprint-mark-arrangement region 33F in a position facing the imprint-mark-arrangement region 33A in the Y direction via both the chip region 31 and the scribe line 33. In this case, the pattern arrangement unit 14A arranges the imprint-mark-arrangement regions 33A and 33F in the respective positions that have the same X coordinate and different Y coordinates on the scribe line 32. Subsequently, the pattern arrangement unit 14A shifts the X coordinate of the imprint-mark-arrangement region 33F such that the X coordinate of the imprint-mark-arrangement region 33A and the X coordinate of the imprint-mark-arrangement region 33F do not overlap each other at all. Accordingly, the imprint-mark-arrangement regions 33A and 33F are arranged in the positions illustrated in FIG. 4B.

The pattern arrangement unit 14A sets the imprint shot shape (the protruding region and the depressed region) such that the temporarily arranged imprint marks 20 remain on the scribe line 32. In other words, the pattern arrangement unit 14A disposes cut-out portions (the depressed regions) in a part of the imprint shot shape such that the temporarily arranged imprint marks 20 are arranged within the protruding regions. At this time, the pattern arrangement unit 14A sets the imprint shot shape based on the arrangement condition 3.

The arrangement condition 3 specifies that, for example, the imprint shot shape is set such that the regions where the imprint-mark-arrangement regions 33A to 33H are arranged on the scribe line 32 are included in the protruding regions. Additionally, the arrangement condition 3 specifies that, for example, the imprint shot shape is set such that the regions where the imprint-mark-arrangement regions 33A to 33H are not arranged on the scribe line 32 are included in the depressed regions.

Accordingly, the pattern arrangement unit 14A sets the imprint shot shape such that, on the scribe line 32, the region where the imprint-mark-arrangement regions 33A to 33H are arranged are included in the protruding regions, and the regions where the imprint-mark-arrangement regions 33A to 33H are not arranged are included in the depressed regions (in step S40). This step S40 is a shot-shape setting process.

Figure 4C:
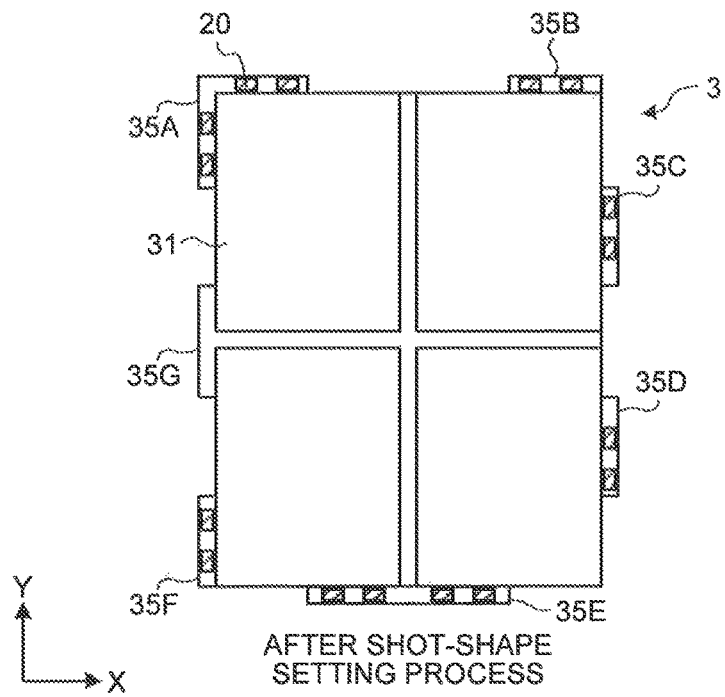
FIG. 4C is a diagram illustrating a state where an imprint shot shape is set with respect to the imprint shot.

FIG. 4C is a diagram illustrating a state where the imprint shot shape is set with respect to the imprint shot. The imprint shot 3 is an imprint shot after an imprint-shot-shape setting process.

For example, the pattern arrangement unit 14A sets a protruding region 35A that includes the imprint-mark-arrangement regions 33A and 33H, and sets a protruding region 35B that includes the imprint-mark-arrangement region 33B. The pattern arrangement unit 14A also sets, for example, a protruding region 35C that includes the imprint-mark-arrangement region 33C, and sets a protruding region 35D that includes the imprint-mark-arrangement region 33D. The pattern arrangement unit 14A also sets, for example, a protruding region 35E that includes the imprint-mark-arrangement regions 33E and 33F, and sets a protruding region 35F that includes the imprint-mark-arrangement region 33G. The pattern arrangement unit 14A also sets, for example, a protruding region 35G in a position where the imprint-mark-arrangement regions 33A to 33H are not arranged on the scribe line 32. Accordingly, at least one protruding region among the protruding regions includes the imprint mark 20.

Furthermore, the pattern arrangement unit 14A sets a region at which the protruding regions 35A to 35G are not set on the scribe line 32, as a depressed region. Accordingly, the protruding regions 35A to 35G are arranged in the positions illustrated in FIG. 4C.

The pattern arrangement unit 14A may set the depressed regions and then set the protruding regions. In this case, the pattern arrangement unit 14A sets the depressed region in a position where the imprint-mark-arrangement regions 33A to 33H are not arranged on the scribe line 32, and then sets the protruding regions 35A to 35G in positions other than the depressed region.

The pattern arrangement unit 14A sets the imprint shot shape, and then arranges the other patterns 30 in a region remaining on the scribe lines 32 and 33 using the scribe patterns (in step S50). At this time, the pattern arrangement unit 14A arranges the other patterns 30 based on the arrangement condition 4. The arrangement condition 4 specifies, for example, the number of arrangement positions of the other patterns 30 and the restriction on the arrangement positions of the other patterns 30.

Figure 4D:
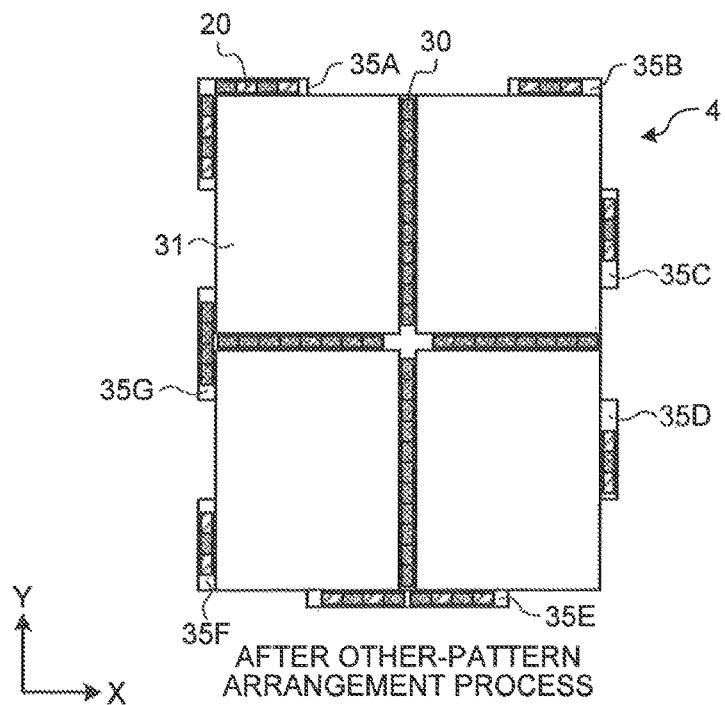
FIG. 4D is a diagram illustrating a state where other patterns are arranged with respect to the imprint shot.

FIG. 4D is a diagram illustrating a state where the other patterns are arranged with respect to the imprint shot. The imprint shot 4 is an imprint shot after the other-pattern arrangement process. For example, the pattern arrangement unit 14A arranges the other patterns 30 in positions where the imprint-mark-arrangement regions 33A to 33H are not arranged on the protruding regions of the scribe line 32, or on the scribe line 33. In the case where the other pattern 30 are arranged in the protruding region of the scribe line 32, the imprint mark 20 and the other pattern 30 are arranged in at least one protruding region among the protruding regions.

The pattern arrangement unit 14A checks whether or not all the other patterns 30 can be arranged in the imprint shot 3. Specifically, the pattern arrangement unit 14A checks whether or not all the necessary scribe patterns (the imprint marks 20 and the other patterns 30) have been arranged (in step S60).

In the case where all the scribe patterns cannot be arranged (No in step S60), the pattern arrangement unit 14A performs arrangement adjusting processing of the imprint marks 20 or the other patterns 30 (processing in Sub1). Specifically, the processing illustrated in FIG. 2B is performed.

The pattern arrangement unit 14A determines whether or not all the scribe patterns can be arranged with respect to the current imprint shot shape (in step S61). In the case where it is determined that there are scribe patterns that cannot be arranged for the current imprint shot shape (No in step S61), the pattern arrangement unit 14A modifies the imprint shot shape (in step S62).

Subsequently, the pattern arrangement unit 14A determines whether or not all the scribe patterns can be arranged for the current (modified) imprint shot shape (in step S61). The pattern arrangement unit 14A repeats the processings in step S62 and step S61 until it is determined that all the scribe patterns can be arranged for the current imprint shot shape.

In the case where it is determined that all the scribe patterns can be arranged for the current imprint shot shape (Yes in step S61), the pattern arrangement unit 14A adjusts the arrangement of the imprint marks 20 for the current imprint shot shape (in step S63). Furthermore, the pattern arrangement unit 14A adjusts the arrangement of the other patterns 30 for the current imprint shot shape (in step S64).

Subsequently, the pattern arrangement unit 14A checks whether or not all the necessary scribe patterns has been arranged (in step S60). The pattern arrangement unit 14A repeats the processing in Sub1 (in steps S61 to S64) and the processing in step S60 until all the necessary scribe patterns has been arranged.

The pattern arrangement unit 14A arranges all the necessary scribe patterns in the imprint shot 3 (Yes in step S60) so as to complete the imprint shot 4, and then terminates designing the mask set. Step S60 and Sub1 described above are the other-pattern arrangement process.

The pattern arrangement unit 14A transmits data for arrangement of the scribe patterns (data of the imprint shot 4) to the output unit 17 as a mask set. The output unit 17 outputs the mask set to, for example, the external device.

When the mask pattern of the semiconductor apparatus is created for each layer, the circuit pattern for each layer is arranged within an imprint shot 5 (not shown). Additionally, the scribe patterns (the imprint marks 20 and the other patterns 30) for each layer are arranged on the scribe line within the imprint shot 5. At this time, the scribe patterns for each layer are arranged based on a mask set designed by the mask-set designing apparatus 10A. Specifically, the scribe patterns for each layer are arranged based on the set arrangement positions of the scribe patterns to the mask set.

Subsequently, the imprint shot 5 is used to produce a template (master plate). The template is used to imprint a wafer (substrate). The imprint on the wafer is performed for each imprint shot.

According to the first embodiment, the imprint shape is set after the imprint marks 20 are temporarily arranged. Subsequently, the other patterns 30 are arranged. This facilitates designing the mask set that includes imprint.

In the case where there is a scribe pattern that cannot be arranged for the current imprint shot shape, the pattern arrangement unit 14A modifies the imprint shot shape. This facilitates arranging the scribe patterns for the imprint shot shape.

The imprint marks 20 and the other patterns 30 are arranged based on the arrangement conditions 1 to 4. Accordingly, with arrangement restrictions on a layer where an imprint is used (an imprint layer) and a layer where an exposure treatment is used (a photomask layer) taken into consideration, a mask set that allows mix-and-match between the imprint layer and the photomask layer is obtained.

Second Embodiment

Next, a second embodiment will be described using FIG. 5 and FIGS. 6A and 6B. In the second embodiment, a mask set is designed after it is verified whether the imprint shots on the substrate do not overlap one another between the adjacent shots when performing an imprint using the imprint shot shape of the designed imprint shot 4.

Hereinafter, an imprint shot where the design is completed is described as the imprint shot 4. An imprint shot to be arranged (imprinted) on the wafer is described as an imprint shot 6X.

Figure 5:
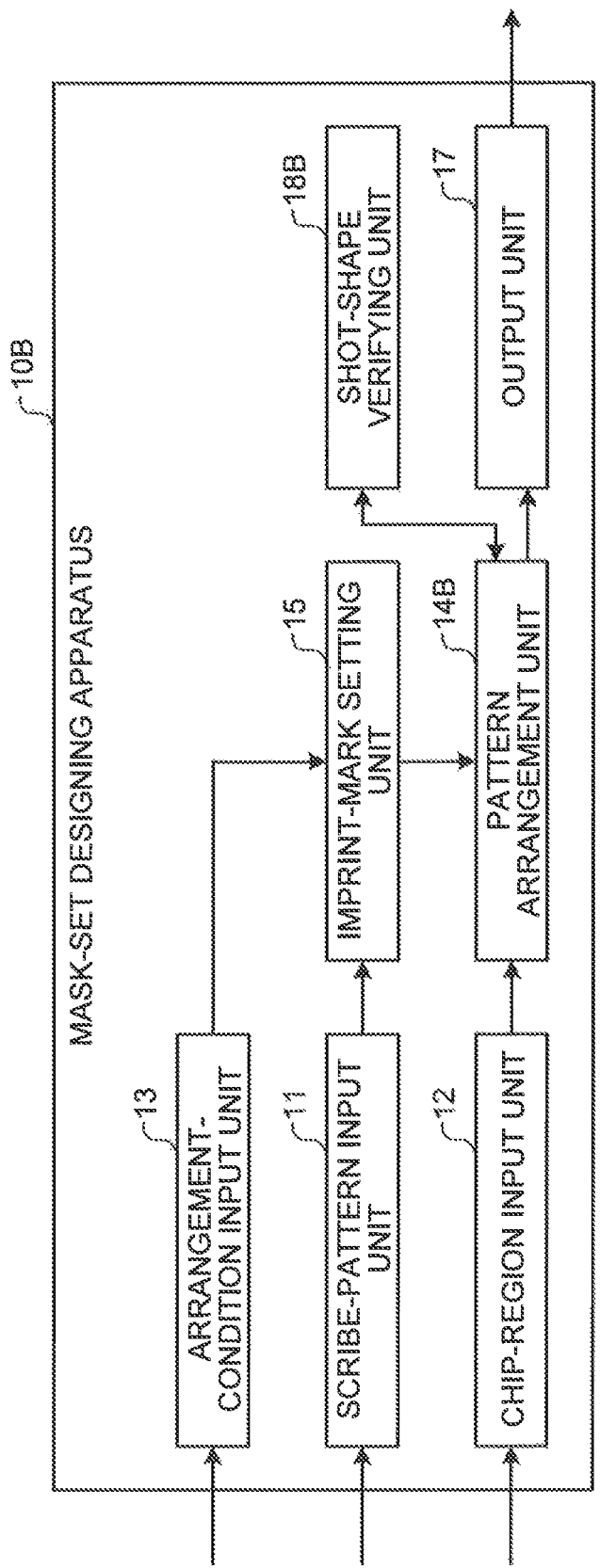
FIG. 5 is a block diagram illustrating a configuration of a mask-set designing apparatus according to a second embodiment.
Figure 6A:
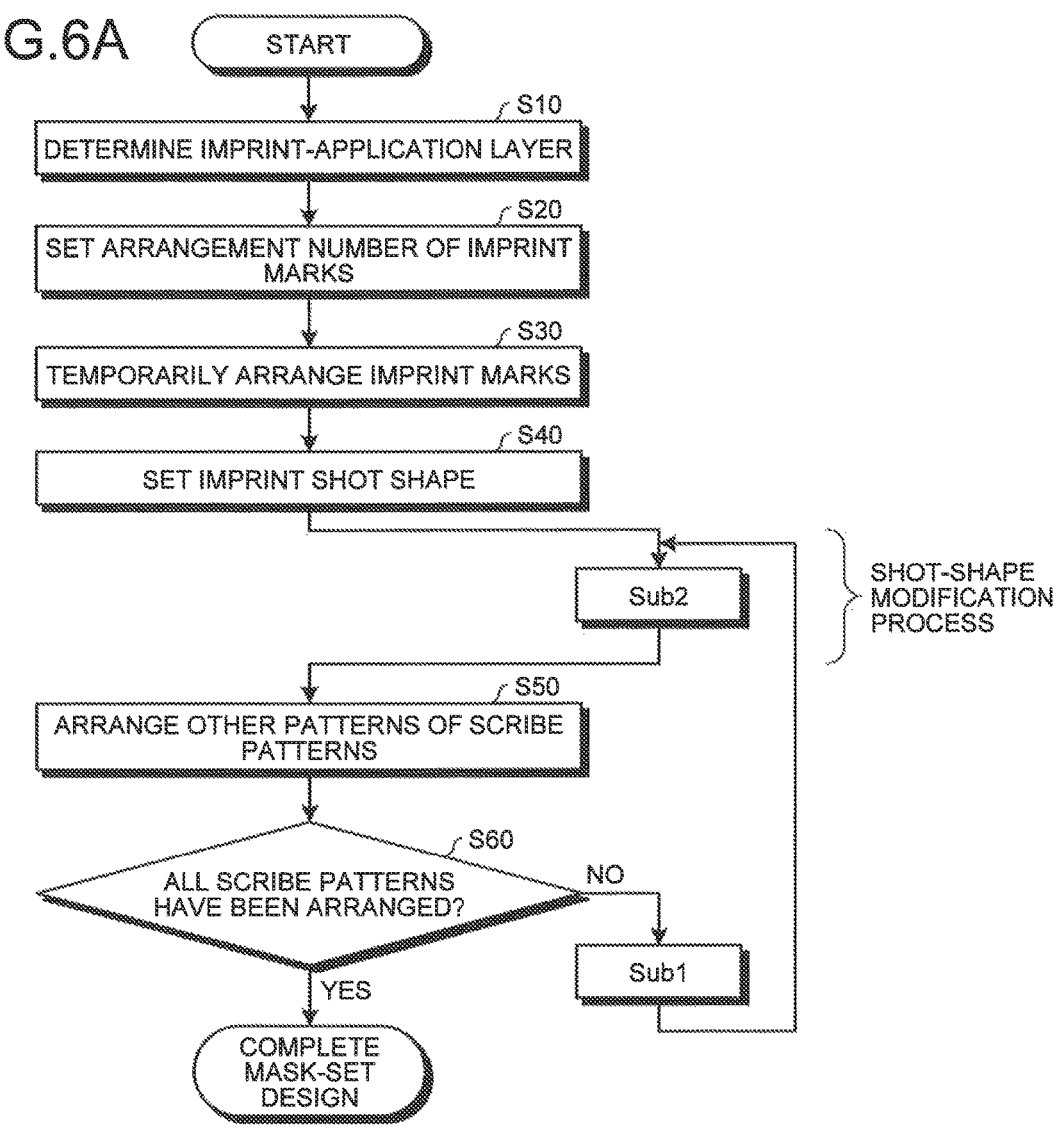
FIGS. 6A and 6B are flowcharts illustrating a processing procedure of mask-set designing processing according to the second embodiment.
Figure 6B:
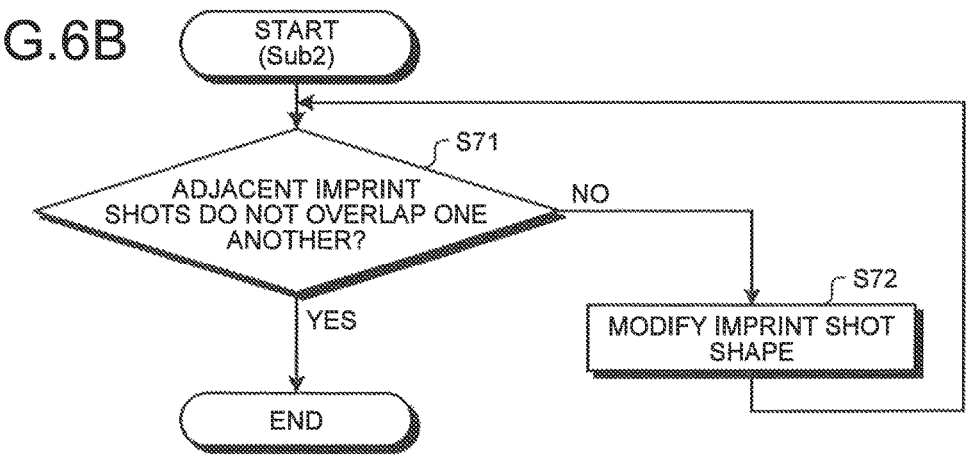

FIG. 5 is a block diagram illustrating a configuration of a mask-set designing apparatus according to the second embodiment. In respective configuration members of FIG. 5, the same reference numerals are given to configuration members that achieve the same functions as those in the mask-set designing apparatus 10A of the first embodiment illustrated in FIG. 1, and the repeated description will be omitted correspondingly.

A mask-set designing apparatus 10B has a function to verify whether the imprint shots 6X do not overlap one another between the adjacent shots (a shot-shape verifying unit 18B described later), compared with the mask-set designing apparatus 10A.

Specifically, the mask-set designing apparatus 10B includes the scribe-pattern input unit 11, the chip-region input unit 12, the arrangement-condition input unit 13, a pattern arrangement unit 14B, the imprint-mark setting unit 15, the output unit 17, and the shot-shape verifying unit 18B.

The pattern arrangement unit 14B has a function similar to that of the pattern arrangement unit 14A. The pattern arrangement unit 14B of this embodiment transmits the set imprint shot shape to the shot-shape verifying unit 18B. Additionally, the pattern arrangement unit 14B sets a new imprint shot shape when the pattern arrangement unit 14B has received a verification result of disqualification from the shot-shape verifying unit 18B.

The shot-shape verifying unit 18B is coupled to the pattern arrangement unit 14B. In the case where the protruding regions and the depressed regions that are set to the imprint shot shape have unsuitable shapes, the imprint shots 6X overlap one another between the adjacent shots. Therefore, the shot-shape verifying unit 18B verifies whether or not the imprint shots 6X overlap one another between the adjacent shots in the case where an imprint is performed on the wafer using the imprint shot shape set by the pattern arrangement unit 14B. The shot-shape verifying unit 18B transmits the verification result to the pattern arrangement unit 14B.

Next, a description will be given of a design processing procedure of a mask set according to the second embodiment. FIGS. 6A and 6B are flowcharts illustrating a processing procedure of mask-set designing processing according to the second embodiment. FIG. 6A illustrates arrangement processing of the imprint marks 20 and the other patterns 30 in the mask-set designing processing. FIG. 6B illustrates verification processing of the imprint shot shape in the mask-set designing processing. Here, in the processing procedure illustrated in FIG. 6A, the repeated description of the processing similar to that in FIG. 2A will be omitted.

The mask-set designing apparatus 10B determines an imprint-application layer using processing similar to that of the mask-set designing apparatus 10A (in step S10), and sets the arrangement number of the imprint marks 20 (in step S20). The mask-set designing apparatus 10B temporarily arranges the imprint marks 20 using the processing similar to that of the mask-set designing apparatus 10A (in step S30), and determines an imprint shot shape (in step S40).

Subsequently, the pattern arrangement unit 14B transmits the set imprint shot shape to the shot-shape verifying unit 18B. Thus, the shot-shape verifying unit 18B performs the verification processing of the imprint shot shape (processing in Sub2). Specifically, the processing illustrated in FIG. 6B is performed.

The shot-shape verifying unit 18B verifies whether the imprint shots 6X do not overlap one another between the adjacent shots when performing an imprint on the wafer using the imprint shot shape (in step S71). The shot-shape verifying unit 18B transmits the verification result to the pattern arrangement unit 14B.

In the case where the verification result indicates disqualification, the shot-shape verifying unit 18B may transmit the verification result including information that indicates which of the positions is disqualified (a position where overlap occurs in the imprint shot 4) to the pattern arrangement unit 14B.

In the case where the imprint shots 6X overlap one another between the adjacent shots (No in step S71), the pattern arrangement unit 14B modifies the imprint shot shape (in step S72). At this time, in the case where the pattern arrangement unit 14B has received the information that indicates which of the positions is disqualified from the shot-shape verifying unit 18B, the pattern arrangement unit 14B modifies the imprint shot shape based on this information.

The pattern arrangement unit 14B and the shot-shape verifying unit 18B repeat the processings in step S72 and step S71 until a verification result becomes qualified. In the case where the imprint shots 6X do not overlap one another between the adjacent shots (Yes in step S71), the verification result becomes qualified. Then, the processing in Sub2 (a shot-shape modification process) is terminated.

Subsequently, the pattern arrangement unit 14B arranges the other patterns 30 in regions remaining on the scribe lines 32 and 33 using processing similar to that of the pattern arrangement unit 14A (in step S50). Furthermore, the pattern arrangement unit 14B checks whether or not all the scribe patterns are arranged using processing similar to that of the pattern arrangement unit 14A (in step S60).

In the case where all the scribe patterns cannot be arranged (No in step S60), the pattern arrangement unit 14B performs arrangement adjusting processing of the imprint marks 20 or the other patterns 30 (processing in Sub1) using processing similar to that of the pattern arrangement unit 14A.

In this embodiment, after the pattern arrangement unit 14B completes the processing in Sub1 (after step S64), the processing in Sub2 is performed. Specifically, the pattern arrangement unit 14B and the shot-shape verifying unit 18B perform the processings in steps S71 and S72. In the case where the imprint shots 6X do not overlap one another between the adjacent shots (Yes in step S71), the verification result is qualified. Then, the processing in Sub2 is terminated.

Subsequently, the pattern arrangement unit 14B uses the scribe patterns to arrange the other patterns 30 in regions remaining on the scribe lines 32 and 33, using processing similar to that of the pattern arrangement unit 14A (in step S50).

Subsequently, the pattern arrangement unit 14A checks whether or not all the necessary scribe patterns are arranged (in step S60). The mask-set designing apparatus 10B repeats the processing in Sub1 (in steps S61 to S64), the processing in Sub2 (in steps S71 and S72), and the processings in steps S50 and S60 until all the necessary scribe patterns has been arranged. The pattern arrangement unit 14B arranges all the necessary scribe patterns in the imprint shot 3 (Yes in step S60) so as to complete the imprint shot 4, and then terminates designing the mask set.

According to the second embodiment, it is verified whether the adjacent imprint shots 6X do not overlap one another. In the case where the overlap occurs, the pattern arrangement unit 14A modifies the imprint shot shape. This facilitates arranging the scribe patterns for the imprint shot shape.

Third Embodiment

Next, a third embodiment will be described using FIG. 7 to FIG. 12. In the third embodiment, it is verified whether or not the imprint mark 20 protrudes from the wafer in the peripheral portion of the wafer. In the case where the imprint mark 20 protrudes, the position of the imprint mark 20 is changed.

FIG. 7 is a block diagram illustrating a configuration of a mask-set designing apparatus according to the third embodiment. In respective configuration members of FIG. 7, the same reference numerals are given to configuration members that achieve the same functions as those in the mask-set designing apparatus 10A of the first embodiment illustrated in FIG. 1, and the repeated description will be omitted correspondingly.

A mask-set designing apparatus 10C has a function to verify whether or not the imprint mark 20 protrudes from the wafer in the peripheral portion of the wafer (a chipped-shot verifying unit 19C described later), compared with the mask-set designing apparatus 10A.

Specifically, the mask-set designing apparatus 10C includes the scribe-pattern input unit 11, the chip-region input unit 12, the arrangement-condition input unit 13, a pattern arrangement unit 14C, the imprint-mark setting unit 15, the output unit 17, an arrangement-information input unit 16C, and a chipped-shot verifying unit 19C.

The arrangement-information input unit 16C receives an arrangement of the imprint shots 6X on the wafer (shot-arrangement information) and default positions for the imprint marks 20 that are preliminary arranged within the imprint shot 1 (mark-arrangement information), and transmits these inputs to the chipped-shot verifying unit 19C.

The mark-arrangement information is information indicative of an arrangement of the imprint marks 20 in the imprint shot 1 in the initial state. Accordingly, the mark-arrangement information includes information related to the scribe line 33 between the chip regions 31 within the imprint shot 1 and information related to the scribe line 32 arranged in the outer peripheral portion of the imprint shot 1.

The chipped-shot verifying unit 19C verifies whether there is an imprint marks 20 protruding from the wafer in the imprint shot 6X, which is imprinted onto the peripheral portion of the wafer. Since the wafer to be imprinted has a circular shape, there is an imprint shot 6X that does not completely include a transfer-pattern region in the peripheral portion of the wafer. This type of imprint shot 6X that includes the region protruding from the wafer is a chipped shot.

The chipped-shot verifying unit 19C verifies the existence of the chipped shot based on the shot-arrangement information and the mark-arrangement information. Furthermore, in the case where a chipped shot exists, the chipped-shot verifying unit 19C extracts the imprint mark 20 that is not transferred onto the wafer among the imprint marks 20 within the chipped shot. The chipped-shot verifying unit 19C transmits the verification result to the pattern arrangement unit 14C.

The pattern arrangement unit 14C has a function similar to that of the pattern arrangement unit 14A. Additionally, when the pattern arrangement unit 14C receives the verification result (the position of the imprint mark 20 protruding from the wafer) from the chipped-shot verifying unit 19C, the pattern arrangement unit 14C moves the position of the imprint mark 20 protruding from the wafer to a transferable region within the chipped shot.

Figure 8A:
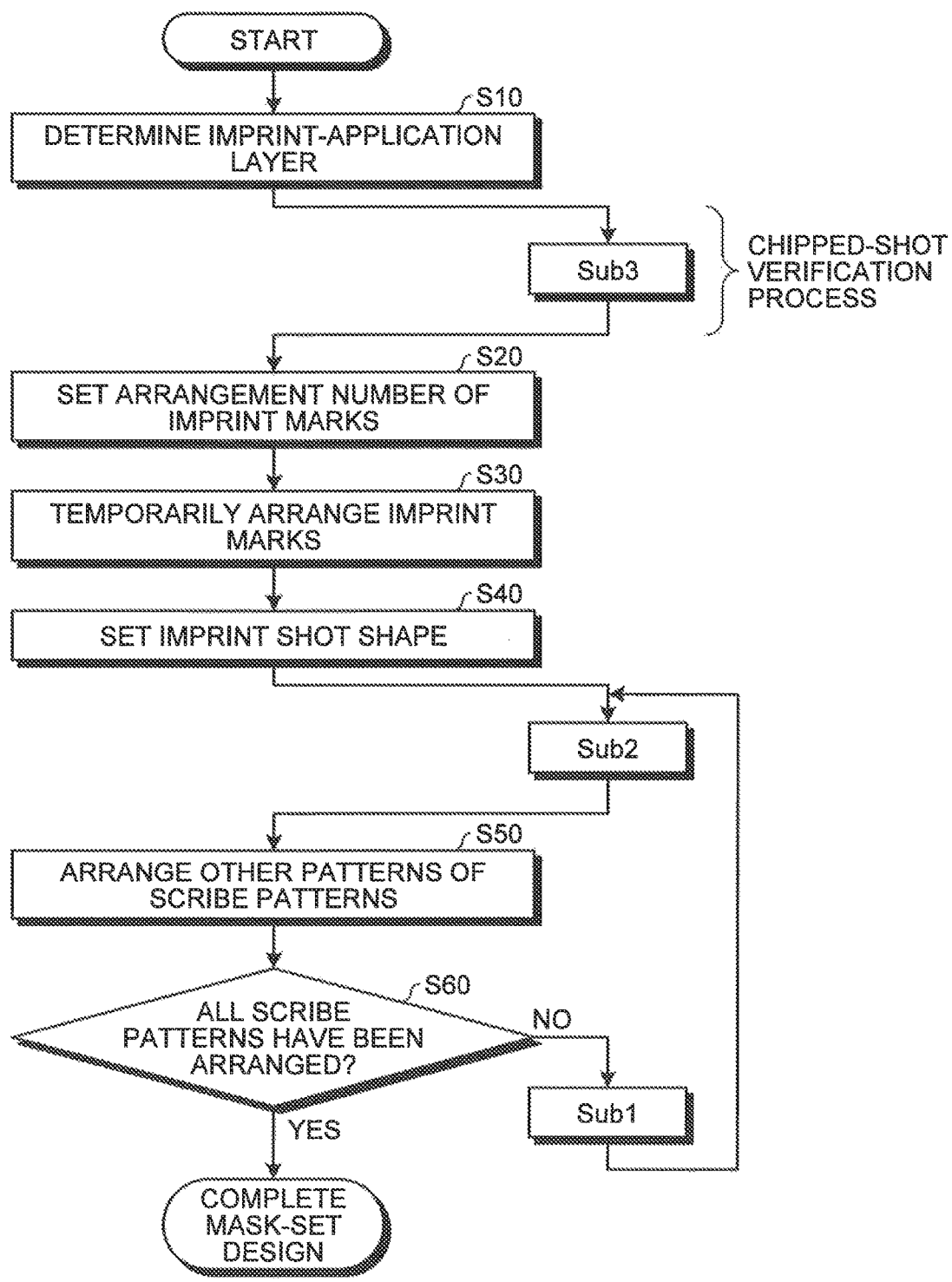
FIG. 8A is a flow chart illustrating a processing procedure of pattern-arrangement processing in the mask-set designing processing.
Figure 8B:
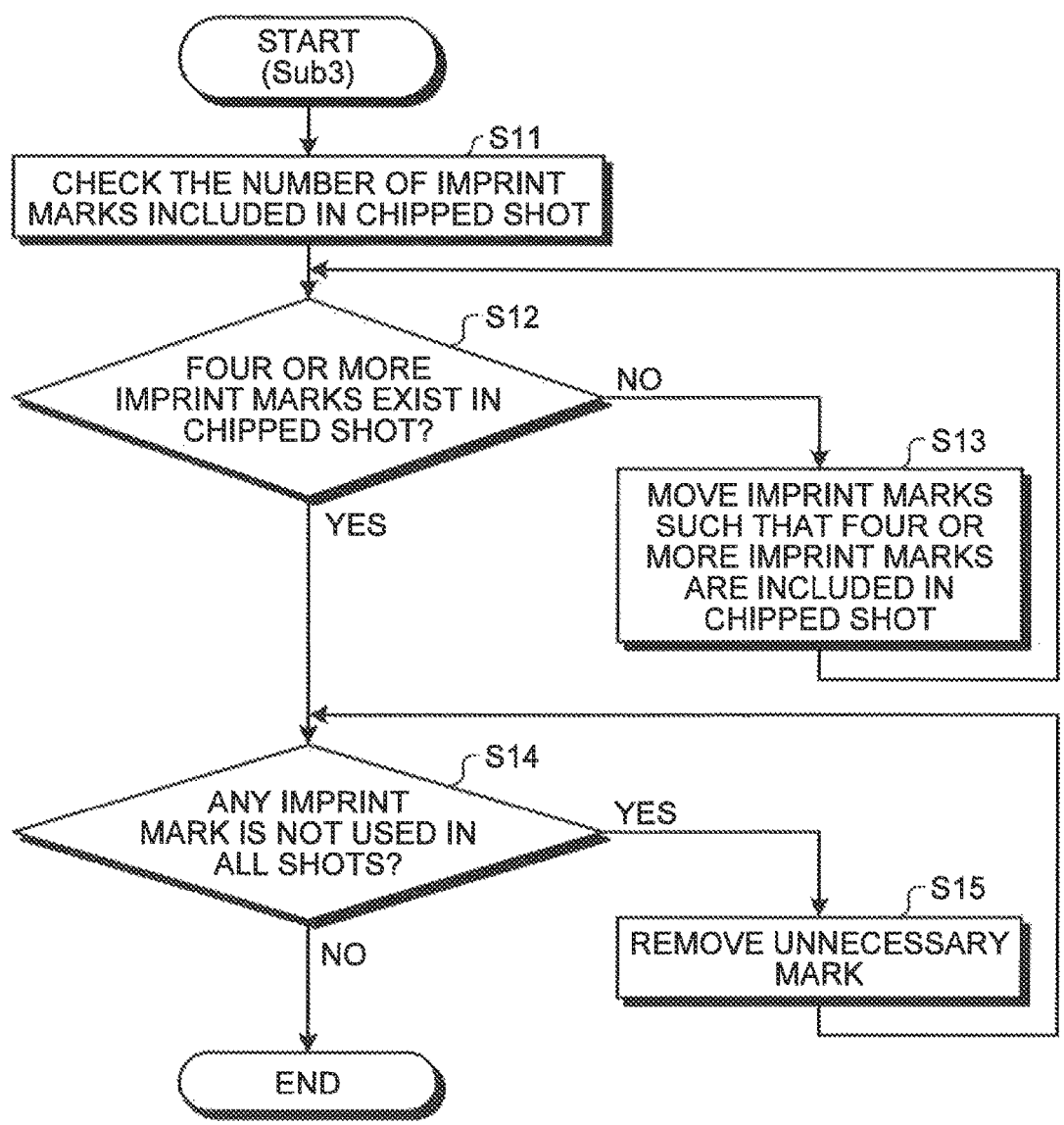
FIG. 8B is a flow chart illustrating a processing procedure of pattern-arrangement adjusting processing in a chipped shot in the mask-set designing processing.

Next, a description will be given of a design processing procedure of a mask set according to the third embodiment. Here, a description will be given of a processing procedure of mask-set designing processing according to the third embodiment using FIG. 8A and FIG. 8B. FIG. 8A is a flow chart illustrating a processing procedure of pattern-arrangement processing in the mask-set designing processing. FIG. 8B is a flow chart illustrating a processing procedure of pattern-arrangement adjusting processing in the chipped shot in the mask-set designing processing. Here, in the processing procedure illustrated in FIG. 8A, the repeated description of the processing similar to that in FIG. 2A or FIG. 6A will be omitted.

The imprint-mark setting unit 15 of the mask-set designing apparatus 10C determines an imprint-application layer using processing similar to that of the mask-set designing apparatus 10A (in step S10). Subsequently, the chipped-shot verifying unit 19C performs verification processing of the chipped shot (processing in Sub3). Specifically, the processing illustrated in FIG. 8B is performed.

The arrangement-information input unit 16C receives the shot-arrangement information and the mark-arrangement information, and transmits them to the chipped-shot verifying unit 19C. The chipped-shot verifying unit 19C verifies the existence of the chipped shot based on the shot-arrangement information and the mark-arrangement information. The shot-arrangement information may be generated by another device other than the mask-set designing apparatus 10C, or may be generated by the chipped-shot verifying unit 19C.

In the case where the chipped-shot verifying unit 19C generates the shot-arrangement information, the chipped-shot verifying unit 19C generates the shot-arrangement information based on the shape and the dimensions of the imprint shot 4 and the dimensions of the transferable region on the wafer. In this case, the chipped-shot verifying unit 19C acquires the shape and the dimensions of the imprint shot 4 from the pattern arrangement unit 14C. The dimensions of the transferable region on the wafer may be input from an external device or similar device to the chipped-shot verifying unit 19C through the arrangement-information input unit 16C, or may be input from a user to the chipped-shot verifying unit 19C through the arrangement-information input unit 16C.

In the case where a chipped shot exists, the chipped-shot verifying unit 19C checks the number and the positions of the imprint marks 20 that are not transferred onto the wafer among the imprint marks 20 within the chipped shot (in step S11).

The chipped-shot verifying unit 19C extracts the number and the positions of the imprint marks 20 that are not transferred onto the wafer, and then transmits this extraction result to the pattern arrangement unit 14C. The pattern arrangement unit 14C determines whether or not the number of the imprint marks 20 in the transferable region within the chipped shot is equal to or more than the specified number (for example, four) (in step S12).

The specified number of the imprint marks 20 may be any number. For example, the specified number may be defined to be twelve in total of four one-dimensional marks in the X direction, four one-dimensional marks in the Y direction, and four two-dimensional marks. The number of two-dimensional marks may be three as the specified number.

In the case where the number of the imprint mark 20 in the transferable region within the chipped shot is not equal to or more than the specified number (No in step S12), the pattern arrangement unit 14C moves the imprint marks 20 within the imprint shot 1 such that the number of the imprint marks 20 in the transferable region within the chipped shot becomes equal to or more than the specified number (here, four pieces) (in step S13).

Specifically, the pattern arrangement unit 14C moves the imprint marks 20 within the imprint shot 1 such that the imprint marks 20 protruding from the transferable region on the wafer becomes contained in the transferable region on the wafer. Here, the pattern arrangement unit 14C may add new imprint marks 20 within the transferable region so as to arrange the specified number or more of the imprint marks 20 within the transferable region of the imprint shot 1.

Figure 9:
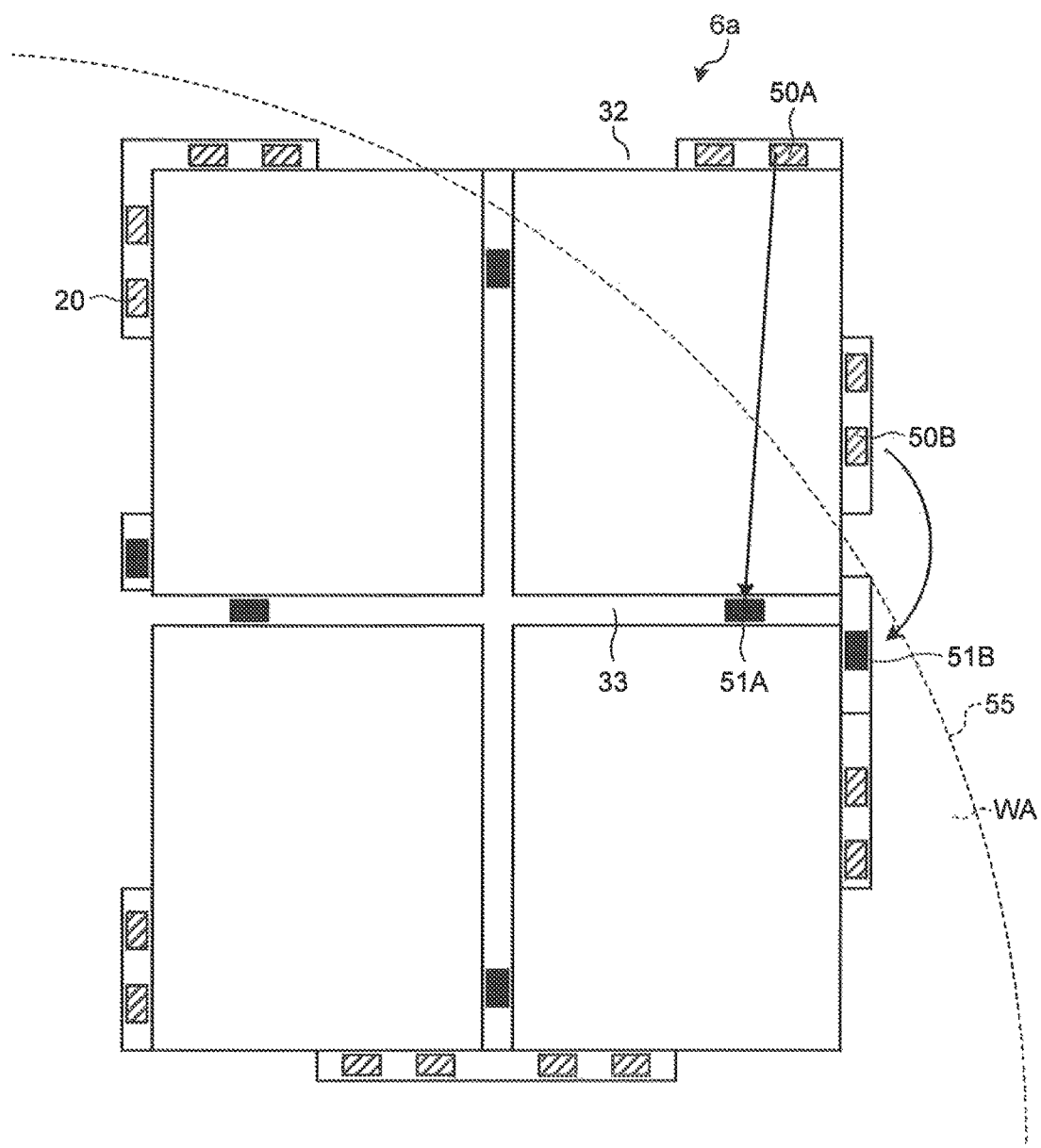
FIG. 9 is a view for describing the arrangement adjusting processing of the imprint mark protruding from the wafer.

FIG. 9 is a view for describing the arrangement adjusting processing of the imprint mark protruding from the wafer. Here, a description will be given of the case where imprint marks 50A and 50B as examples of the imprint mark 20 are moved to arrange imprint marks 51A and 51B.

For example, an imprint shot 6a as an example of the imprint shot 6X is assumed to be a chipped shot. Among the imprint marks within the imprint shot 6a, the imprint marks 20 within a wafer edge line (the transfer boundary) 55 are transferred onto a wafer WA. The imprint marks 50A and 50B outside of the wafer edge line 55 are not transferred onto the wafer WA.

In this case, the pattern arrangement unit 14C moves the imprint marks 50A and 50B within the imprint shot 1 such that the imprint marks 50A and 50B that protrude from the wafer WA become contained in positions within the wafer WA (transferable regions within the imprint shot 6a).

The pattern arrangement unit 14C moves the imprint mark 50A disposed on the scribe line 32 onto the scribe line 33, so as to arrange a new imprint mark 51A. Additionally, the pattern arrangement unit 14C moves the imprint mark 50B disposed on the scribe line 32 onto the scribe line 32, so as to arrange a new imprint mark 51B.

Regarding all the chipped shots, the pattern arrangement unit 14C moves the imprint marks 50A and 50B that protrude from the wafer WA, so as to arrange the new imprint marks 51A and 51B. In other words, the pattern arrangement unit 14C performs the moving processing of the imprint marks for all the chipped shots.

The pattern arrangement unit 14C moves or adds the imprint marks 20, and then determines whether or not the number of the imprint marks 20 within the transferable region of the chipped shot is equal to or more than the specified number (in step S12). In the case where the number of the imprint marks 20 within the transferable region of the chipped shot is equal to or more than the specified number (Yes in step S12), the pattern arrangement unit 14C determines whether or not there is any imprint mark 20 (unnecessary mark) that is not used in all the imprint shots 6X on the wafer (in step S14).

In the case where there is an imprint mark 20 that is not used in all the imprint shots 6X on the wafer (Yes in step S14), the pattern arrangement unit 14C removes the unnecessary mark from the imprint shot 4 (in step S15).

Subsequently, the pattern arrangement unit 14C determines whether there is an imprint mark 20 that is not used (the unnecessary mark) in all the imprint shots 6X on the wafer (in step S14). In the case where there is no unnecessary mark (No in step S14), the pattern arrangement unit 14C terminates the processing in Sub3 (chipped-shot verification process). Accordingly, the imprint mark 20 that has not been moved and the imprint marks 50A and 50B that have been arranged by the movement are arranged on the imprint shot 1. The arrangement positions of these imprint marks 20, 50A, and 50B are used as the initial arrangement to design the imprint shot 4.

Specifically, processing similar to that described in the second embodiment (FIG. 6A) is used to design the imprint shot 4. In this case, the processings in steps S20 to S40, the processing in Sub2, the processings in steps S50 and S60, and the processing in Sub1 are performed.

The mask-set designing apparatus 10C may design the imprint shot 4 using processing similar to the processing described in the first embodiment (FIG. 2A). In this case, the processings in steps S20 to S60 and the processing in Sub1 are performed.

The chipped-shot verifying unit 19C and the pattern arrangement unit 14C may perform the processing in Sub3 after temporarily arranging the imprint marks (after step S30). In this case, the chipped-shot verifying unit 19C uses the positions of the imprint marks 20 temporarily arranged in the imprint shot 2 as default positions (the mark-arrangement information) to perform the processing in Sub3.

In the case where the shot-arrangement information is generated by another device other than the mask-set designing apparatus 10C, the pattern arrangement unit 14C needs not set the scribe line 33 between the chip regions 31 within the imprint shot 1 and needs not set the scribe line 32 arranged in the outer peripheral portion of the imprint shot 1. The pattern arrangement unit 14C acquires information of the imprint shot 1 to which the chip region 31 and the scribe lines 32 and 33 are set, from the shot-arrangement information.

Incidentally, in the protruding regions set for the scribe line 32, at the outer peripheral portions, a desired template pattern might not be formed due to process accuracy during the template formation. For example, the template with a process error may cause an overlap of the adjacent imprint shots 6X one another during the imprint. That is, in the case where, for example, the template becomes larger than desired dimensions, the adjacent imprint shots 6X overlap one another.

Accordingly, the pattern arrangement unit 14C of this embodiment does not arrange the imprint marks 20 or the other patterns 30 in the outer peripheral region (a first pattern-arrangement inhibited region) on the imprint shot 4 corresponding to the outer peripheral region of the imprint shot 6X. Specifically, the pattern arrangement unit 14C disposes the first pattern-arrangement inhibited region in the protruding region, and then arranges the imprint marks 20 and the other patterns 30 in regions other than the first pattern-arrangement inhibited region.

In top view of the imprint shot 6X, a region at a corner (an apex of the protruding region) may have a cross-sectional shape in a rounded shape or a mesa shape (corner rounding) due to etching process accuracy when the template pattern is etched.

Accordingly, the pattern arrangement unit 14C of this embodiment does not arrange the imprint marks 20 or the other patterns 30 in a corner region (a second pattern-arrangement inhibited region) on the imprint shot 4 corresponding to a corner region of the imprint shot 6X. Specifically, the pattern arrangement unit 14C disposes the second pattern-arrangement inhibited region in the protruding region, and then arranges the imprint marks 20 and the other patterns 30 in regions other than the second pattern-arrangement inhibited region.

Figure 10A:
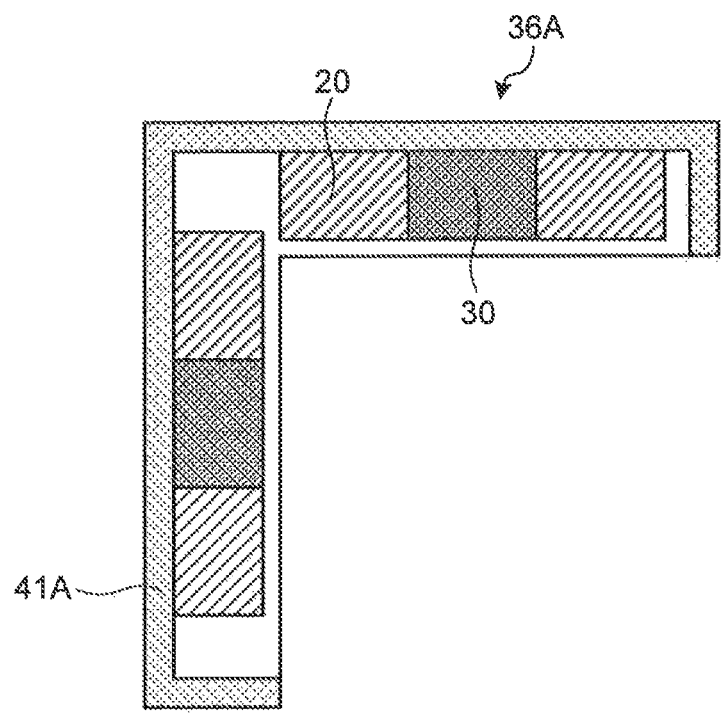
FIGS. 10A and 10B are diagrams illustrating a protruding region with a first pattern-arrangement inhibited region.
Figure 10B:
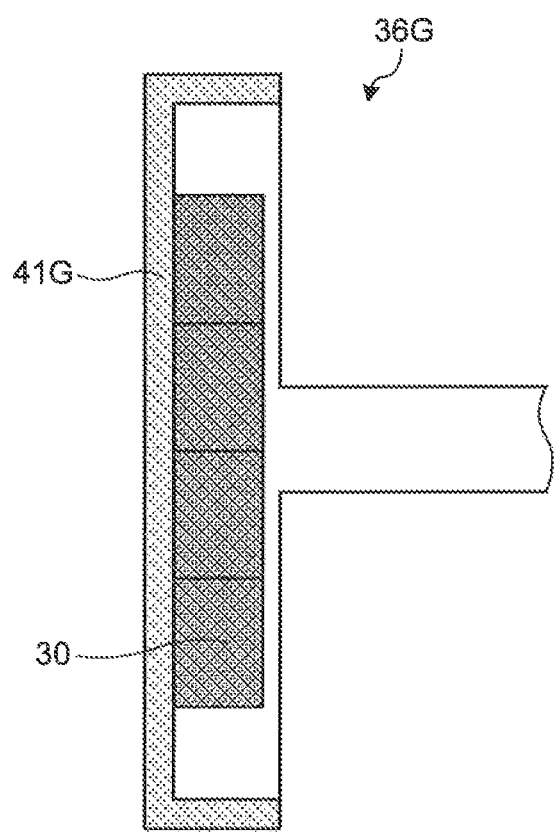

FIGS. 10A and 10B are diagrams illustrating a protruding region with the first pattern-arrangement inhibited region. A protruding region 36A illustrated in FIG. 10A corresponds to the protruding region 35A illustrated in FIG. 4C with the first pattern-arrangement inhibited region (an inhibited region 41A). Here, disposing the inhibited region 41A narrows the region for arranging the imprint marks 20 and the other patterns 30. Accordingly, the protruding region 36A may be formed larger than the protruding region 35A.

The protruding region 36G illustrated in FIG. 10B corresponds to the protruding region 35G illustrated in FIG. 4C with the first pattern-arrangement inhibited region (an inhibited region 41G). Here, disposing the inhibited region 41G narrows the region for arranging the imprint marks 20 and the other patterns 30. Accordingly, the protruding region 36G may be formed larger than the protruding region 35G.

Figure 11A:
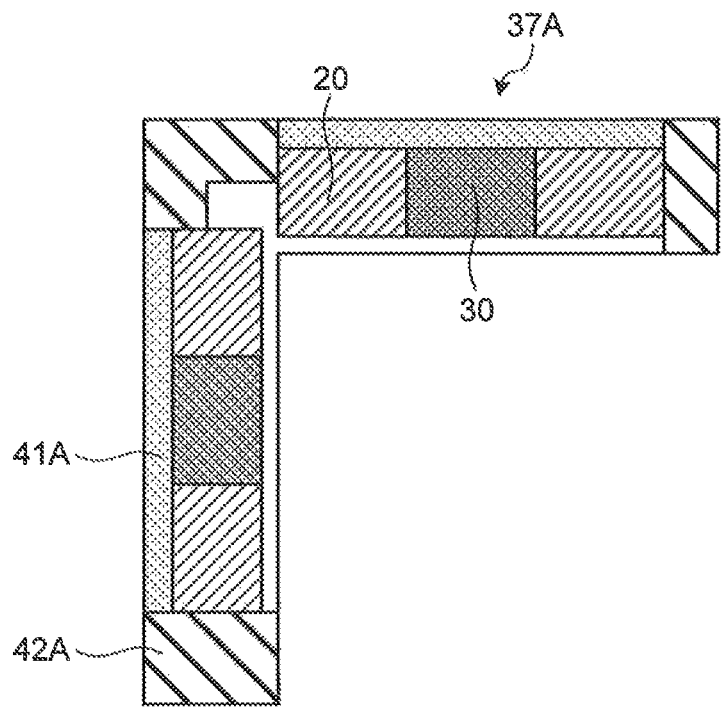
FIGS. 11A and 11B are diagrams illustrating a protruding region with a second pattern-arrangement inhibited region.
Figure 11B:
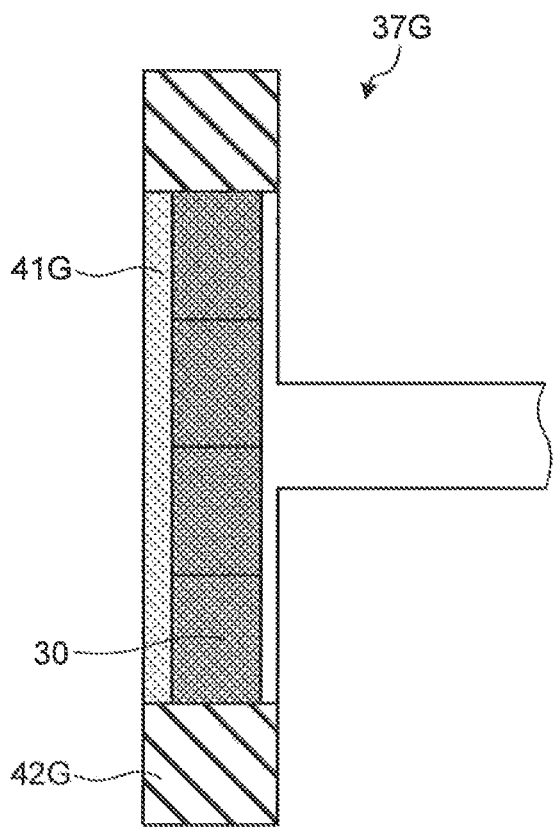

FIGS. 11A and 11B are diagrams illustrating a protruding region with the second pattern-arrangement inhibited region. A protruding region 37A illustrated in FIG. 11A corresponds to the protruding region 35A illustrated in FIG. 4C with the first pattern-arrangement inhibited region (the inhibited region 41A) and the second pattern-arrangement inhibited region (an inhibited region 42A). Here, disposing the inhibited regions 41A and 42A narrows the region for arranging the imprint marks 20 and the other patterns 30. Accordingly, the protruding region 37A may be formed larger than the protruding region 35A. In the protruding region 37A, only the inhibited region 42A may be formed without disposing the inhibited region 41A.

The protruding region 37G illustrated in FIG. 11B corresponds to the protruding region 35G illustrated in FIG. 4C with the inhibited region 41G and an inhibited region 42G. Here, disposing the inhibited regions 41G and 42G narrows the region for arranging the imprint marks 20 and the other patterns 30. Accordingly, the protruding region 37G may be formed larger than the protruding region 35G. In the protruding region 37G, only the inhibited region 42G may be disposed without disposing the inhibited region 41G.

After the mask set has been designed, this mask set is used to fabricate a semiconductor apparatus (a semiconductor integrated circuit). Specifically, the mask set is used to produce a photomask or a template for each layer. At this time, the template is produced for the imprint-application layer while the photomask is produced for a layer (a photolithography-application layer) other than the imprint-application layer.

Subsequently, in the photolithography-application layer, the wafer over which resist is applied is exposed using the photomask. Then, the wafer is developed so as to form a resist pattern on the wafer. Subsequently, etching is performed using this resist pattern as a mask, so as to form an actual pattern corresponding to the resist pattern on the wafer.

In the imprint-application layer, the wafer over which resist is applied is imprinted using the template, so as to form a resist pattern on the wafer. Subsequently, etching is performed using this resist pattern as a mask, so as to form an actual pattern corresponding to the resist pattern on the wafer.

When the semiconductor apparatus is fabricated, after the above-described mask set is designed, formation of a resist pattern using the photomask or the template, etching process, and a similar process are repeated for each layer.

Next, a description will be given of hardware configurations of the mask-set designing apparatuses 10A to 10C. The mask-set designing apparatuses 10A to 10C have the hardware configurations similar to one another. Here, a description will be given of the hardware configuration of the mask-set designing apparatus 30A.

Figure 12:
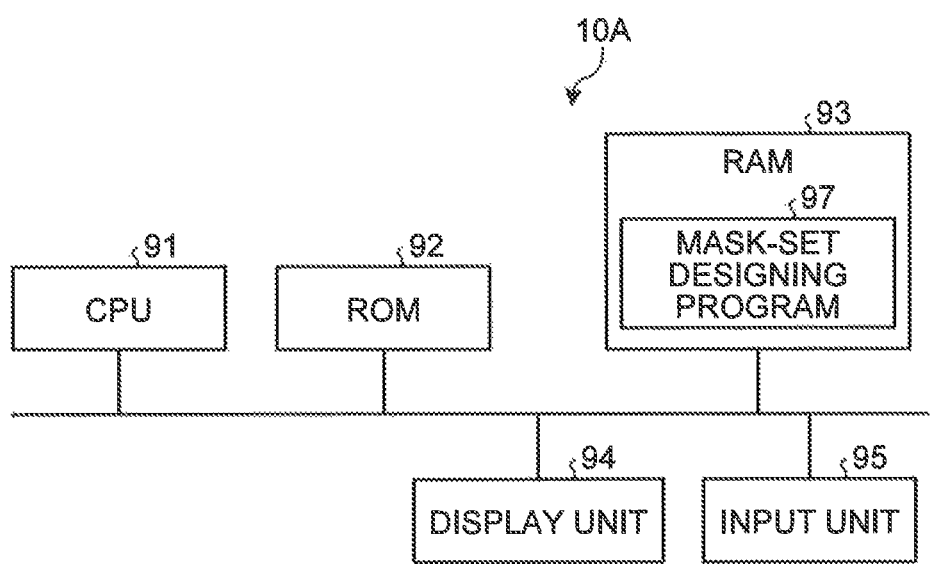
FIG. 12 is a diagram illustrating a hardware configuration of the mask-set designing apparatus.

FIG. 12 is a diagram illustrating the hardware configuration of the mask-set designing apparatus. The mask-set designing apparatus 10A includes a Central Processing Unit (CPU) 91, a Read Only Memory (ROM) 92, a Random Access Memory (RAM) 93, a display unit 94, and an input unit 95. In the mask-set designing apparatus 10A, the CPU 91, the ROM 92, the RAM 93, the display unit 94, and the input unit 95 are coupled to one another through a bus line.

The CPU 91 uses a mask-set designing program 97 as a computer program to design the mask set. The mask-set designing program 97 is a computer program product that includes a nontransitory computer readable medium storing a plurality of computer-executable instructions for designing the mask set. With the mask-set designing program 97, the plurality of instructions causes the computer to execute designing of the mask set.

The display unit 94 is a display device such as an LCD monitor, and displays, for example, the scribe patterns and the imprint shots 1 to 4 based on the instruction from the CPU 91. The input unit 95 includes a computer mouse and a keyboard, and inputs the instruction information (parameters necessary for designing the mask set) externally input from the user. The instruction information input to the input unit 95 is transmitted to the CPU 91.

The mask-set designing program 97 is stored in the ROM 92, and is loaded to the RAM 93 through the bus line. FIG. 12 illustrates the mask-set designing program 97 that is loaded to the RAM 93.

The CPU 91 executes the mask-set designing program 97 loaded in the RAM 93. Specifically, in the mask-set designing apparatus 10A, the CPU 91 reads out the mask-set designing program 97 from the inside of the ROM 92 in accordance with the instruction input from the input unit 95 by the user, and then expand the mask-set designing program 97 to a program storage region in the RAM 93, so as to execute various processings. The CPU 91 temporarily stores various data generated during the various processings in a data storage region formed in the RAM 93.

The mask-set designing program 97 executed in the mask-set designing apparatus 10A has a module configuration that includes the imprint-mark setting unit 15 and the pattern arrangement unit 14A. These units are loaded onto a main storage unit, and these units are generated on the main storage unit.

The mask-set designing program 97 to be executed in the mask-set designing apparatus 10B described in the second embodiment has a module configuration that includes the imprint-mark setting unit 15, the pattern arrangement unit 14B, and the shot-shape verifying unit 18E.

The mask-set designing program 97 to be executed in the mask-set designing apparatus 100C described in the third embodiment has a module configuration that includes the imprint-mark setting unit 15, the pattern arrangement unit 14C, and the chipped-shot verifying unit 19C.

Thus, according to the third embodiment, it is verified whether there is an imprint mark 20 protruding from the wafer in the chipped shot. In the case where the imprint mark 20 protruding from the wafer exists, the pattern arrangement unit 14C changes the position of the imprint mark 20. This facilitates arranging the scribe patterns for the imprint shot shape.

Additionally, the imprint mark 20 is moved or added based on the position of the imprint mark 20 in the chipped shot. This improves alignment accuracy with respect to the chipped shot. Additionally, the imprint mark 20 is arranged in the proximity of the four corners of the imprint shot 1. This allows obtaining high alignment accuracy with respect to a full shot of the imprint.

In the first and second pattern-arrangement inhibited regions, the imprint marks 20 and the other patterns 30 are not arranged. This prevents an incomplete scribe pattern on the template.

Conventionally, the imprints cannot include a shared portion between adjacent shots. Thus, it was impossible that the imprints overlap one another. Accordingly, in the case where an imprint is applied to a mask set (a mask set for photolithography) with shot arrangement where the adjacent shots share a scribe line, it had been necessary that the photomask and the imprint be different in shot shape or shot size. In the case where the shot shape and the shot size are different from one another, the respective pattern arrangements on the scribe line differ from each other. Therefore, it was impossible that an imprint is simply replaced and performed only in an application-target layer.

In the first to third embodiments, the imprint shot shape is set after the imprint marks 20 are temporarily arranged. Subsequently, the other patterns 30 are arranged. Accordingly, the first to third embodiments facilitate designing the mask set that includes the photomask and the imprint.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A template comprising:
    a shot region to be imprinted onto a substrate, the shot region including:
        chip regions; and
        a scribe region, the scribe region being a region in which an imprint-alignment mark and another pattern are arranged, the scribe region including:
            a first scribe region, the first scribe region being located in between the chip regions; and
            a second scribe region, the second scribe region surrounding the chip regions, the second scribe region including:
                a protruding region, the protruding region being a region in which a pattern is arranged; and
                a depressed region, the depressed region being a region in which no pattern is arranged,
            wherein, when viewed from the top, the protruding region and the depressed region are shaped to fit one another to constitute a scribe line between adjacent shot regions.

2. The template according to claim 1, wherein
    the imprint-alignment mark and said another pattern are arranged in the protruding region, and
    said another pattern includes at least one of an overlay inspection mark, an exposure alignment mark, and a TEG pattern, the overlay inspection mark being used for inspection of an overlay displacement between a pattern formed at an upper layer side and a pattern formed at a lower layer side, the exposure alignment mark being used for alignment during exposure.

3. The template according to claim 1, wherein
    the shot region is formed such that the shot regions do not overlap one another when the shot regions are arranged.

4. The template according to claim 1, wherein
    the imprint-alignment mark and said another pattern are not arranged in an outer peripheral region not in contact with the chip region in an outer peripheral portion of the protruding region, and the imprint-alignment mark and said another pattern are arranged in a region other than the outer peripheral region.

5. A template comprising:
a shot region to be imprinted onto a substrate, the shot region including:
  chip regions; and
  a scribe region, the scribe region being a region in which an imprint-alignment mark and another pattern are arranged, the scribe region including:
    a first scribe region, the first scribe region being located in between the chip regions; and
    a second scribe region, the second scribe region surrounding the chip regions, the second scribe region including:
      a protruding region, the protruding region being a region in which a pattern is arranged; and
      a depressed region, the depressed region being a region in which no pattern is arranged,
wherein, when viewed from the top, the protruding region and the depressed region face each other across the chip regions.

* * * * *